US010242903B2

(12) United States Patent
Ichinose et al.

(10) Patent No.: US 10,242,903 B2
(45) Date of Patent: Mar. 26, 2019

(54) SUCTION DEVICE, CARRY-IN METHOD, CARRIER SYSTEM AND EXPOSURE APPARATUS, AND DEVICE MANUFACTURING METHOD

(71) Applicant: NIKON CORPORATION, Tokyo (JP)

(72) Inventors: Go Ichinose, Fukaya (JP); Taisuke Ibe, Fukaya (JP)

(73) Assignee: NIKON CORPORATION, Tokyo (JP)

( * ) Notice: Subject to any disclaimer, the term of this patent is extended or adjusted under 35 U.S.C. 154(b) by 378 days.

(21) Appl. No.: 14/648,286

(22) PCT Filed: Nov. 27, 2013

(86) PCT No.: PCT/JP2013/081851
§ 371 (c)(1),
(2) Date: Sep. 25, 2015

(87) PCT Pub. No.: WO2014/084228
PCT Pub. Date: Jun. 5, 2014

(65) Prior Publication Data
US 2016/0005636 A1   Jan. 7, 2016

Related U.S. Application Data

(60) Provisional application No. 61/731,573, filed on Nov. 30, 2012.

(51) Int. Cl.
*G03B 27/52* (2006.01)
*H01L 21/683* (2006.01)
(Continued)

(52) U.S. Cl.
CPC ....... *H01L 21/6838* (2013.01); *B25J 11/0095* (2013.01); *G03F 7/70908* (2013.01); *H01L 21/68742* (2013.01)

(58) Field of Classification Search
CPC ............. B25J 11/0095; C03F 7/70908; H01L 21/6838; H01L 21/68742
(Continued)

(56) References Cited

U.S. PATENT DOCUMENTS 5,969,441 A   10/1999   Loopstra et al.
6,208,407 B1   3/2001   Loopstra
(Continued)

FOREIGN PATENT DOCUMENTS

CN   101553347 A   10/2009
DE   102008023907 A1   12/2009
(Continued)

OTHER PUBLICATIONS

Jan. 3, 2017 Search Report Issued in European Patent Application No. 13858330.7.
(Continued)

*Primary Examiner* — Peter B Kim
(74) *Attorney, Agent, or Firm* — Oliff PLC

(57) ABSTRACT

In a carrier system, a chuck unit is used to hold a placed wafer from above, and vertical-motion pins use suction to hold the wafer from below. Then, the chuck unit and the vertical-motion pins are subsequently lowered until a bottom surface of the wafer comes into contact with a wafer table. During the lowering, the holding force exerted by the chuck unit and the arrangement of chuck members are optimally adjusted such that, as a result of the restraint of the wafer by the chuck unit and the vertical-motion pins, localized surplus-restraint is imparted to the wafer, and warping does not occur.

9 Claims, 10 Drawing Sheets

(51) Int. Cl.
*H01L 21/687* (2006.01)
*B25J 11/00* (2006.01)
*G03F 7/20* (2006.01)

(58) Field of Classification Search
USPC .............................................. 355/30, 72, 75
See application file for complete search history.

(56) References Cited

U.S. PATENT DOCUMENTS

| | | |
|---|---|---|
| 6,590,634 B1 | 7/2003 | Nishi et al. |
| 6,611,316 B2 | 8/2003 | Sewell |
| 6,952,253 B2 | 10/2005 | Lof et al. |
| 7,023,610 B2 | 4/2006 | Ohtsuki et al. |
| 2003/0025890 A1 | 2/2003 | Nishinaga |
| 2003/0077879 A1 | 4/2003 | Ohno et al. |
| 2004/0207824 A1 | 10/2004 | Lof et al. |
| 2007/0127006 A1 | 6/2007 | Shibazaki |
| 2008/0088843 A1 | 4/2008 | Shibazaki |
| 2008/0129064 A1 | 6/2008 | Harvey |
| 2009/0026676 A1 | 1/2009 | Kurita et al. |
| 2010/0073652 A1 | 3/2010 | Shibazaki |
| 2010/0073653 A1 | 3/2010 | Shibazaki |
| 2010/0297562 A1 | 11/2010 | Shibazaki |

FOREIGN PATENT DOCUMENTS

| | | |
|---|---|---|
| EP | 1 420 298 A2 | 5/2004 |
| JP | 2003-133261 A | 5/2003 |
| JP | 2004-140058 A | 5/2004 |
| JP | 2006-114640 A | 4/2006 |
| JP | 2013-219069 A | 10/2013 |
| WO | 99/49504 A1 | 9/1999 |
| WO | 2004/055803 A1 | 7/2004 |
| WO | 2005/074014 A1 | 8/2005 |

OTHER PUBLICATIONS

Dec. 14, 2016 Office Action issued in Chinese Patent Application No. 201380071739.5.
Mar. 4, 2014 International Search Report issued in International Patent Application No. PCT/JP2013/081851.
Mar. 4, 2014 Written Opinion issued in International Patent Application No. PCT/JP2013/081851.
Jun. 27, 2017 Office Action issued in Japanense Patent Application No. 2014-550207.

SUCTION DEVICE, CARRY-IN METHOD, CARRIER SYSTEM AND EXPOSURE APPARATUS, AND DEVICE MANUFACTURING METHOD

TECHNICAL FIELD

The present invention relates to suction devices, carry-in methods, carrier systems and exposure apparatuses, and device manufacturing methods, and more particularly to a suction device in which its suction force acts in a non-contact manner on a plate-like object, a carry-in method in which carry-in is performed of the plate-like object onto a movable body, a carrier system suitable for carrying out the carry-in method and an exposure apparatus which is equipped with the carrier system, and a device manufacturing method which uses the exposure apparatus.

BACKGROUND ART

Conventionally, in a lithography process to manufacture electronic devices (microdevices) such as a semiconductor device (an integrated circuit or the like) or a liquid crystal display device, mainly, a projection exposure apparatus of a step-and-repeat method (a so-called stepper), projection exposure apparatus of a step-and-scan method (a so-called scanning stepper (also called a scanner)) or the like is mainly used.

Substrates such as a wafer, a glass plate and the like subject to exposure that are used in these types of exposure apparatuses are gradually becoming larger (for example, in the case of a wafer, in every ten years). Although a 300-mm wafer which has a diameter of 300 mm is currently the mainstream, the coming of age of a 450 mm wafer which has a diameter of 450 mm looms near. When the transition to 450 mm wafers occurs, the number of dies (chips) output from a single wafer becomes double or more than the number of chips from the current 300 mm wafer, which contributes to reducing the cost.

However, because the thickness does not necessarily increase in proportion to the size of the wafer, the 450 mm wafer is extremely weak in intensity and rigidity when compared with the 300 mm wafer. Therefore, when focusing on a point such as a carriage of a wafer, it was considered that there was a risk of warping occurring in the wafer, which may negatively effect the exposure accuracy when a means method similar to the current 300 mm wafer was employed. Accordingly, as the carry-in method of the wafer, a proposal is made of a carry-in method or the like that can be employed even when the wafer is a 450 mm wafer in which the wafer is suctioned from above in a non-contact manner by a carrier member equipped with a Bernoulli chuck or the like to maintain the flatness degree (flatness) and performs carry-in onto a wafer holder (holding device) (for example, refer to PTL 1).

However, in the case of employing the non-contact suction from above by the carrier member described above as a carry-in method of the wafer onto the wafer stage (wafer holder), there was a risk of positional deviation (rotation deviation) in a horizontal plane of the wafer being generated at an unacceptable level, to which correction based on measurement results was difficult to perform.

CITATION LIST

Patent Literature

[PTL 1] U.S. Patent Application Publication No. 2010/0297562

SUMMARY OF INVENTION

Solution to Problem

As a method for resolving the inconvenience due to suction in a non-contact manner from above by the wafer carrier member described above, a method can be considered in which while a wafer is suctioned in a non-contact manner suction from above by a Bernoulli chuck or the like, the wafer is also supported from below by a support section (for example, vertical-motion pins on a wafer stage). However, according to studies of the inventors, in the case of performing loading of the wafer onto the wafer stage in a non-contact suction from above the wafer and support from below, it became clear that warping that is not acceptable could occur even in the case of a 300 mm wafer. By investigating the cause of this warping of the wafer, the inventors reached a conclusion that the main factor is surplus-restraint which occurs due to the wafer being vertically restrained around the center of the wafer.

According to a first aspect of the present invention, there is provided a first suction device in which a suction force is made to act on a plate-like object in a non-contact manner, comprising: a base member; and a plurality of suction members provided at the base member that each generates a gas flow around the object to make a force which suctions the object, wherein the plurality of suction members generate the gas flow in a mutually different state.

According to this device, the suction force with respect to the object generated by each of the plurality of suction members, can be made different according to, for example, the position on the base member of each suction member. Therefore, for example, in the case of performing support of the object from below by the support section and suction in a non-contact manner from above of the object by this suction device, it becomes possible to make the suction force generated by the suction members placed at a part facing the support section of the base member be weaker than the suction force generated by the suction members placed at a part which does not face the support section of the base member.

According to a second aspect of the present invention, there is provided a second suction device in which a suction force is made to act on a plate-like object in a non-contact manner, comprising: a base member; a plurality of gas flow holes provided at the base member that each generates a gas flow around the object; and an adjustment device which deforms the object, wherein the object is deformed by the adjustment device while the object is held by the gas flow via the plurality of gas flow holes.

According to this device, while holding the object by the gas flow via the plurality of gas flow holes, it becomes possible for the adjustment device to deform the object, for example, so that a desired level of flatness is secured.

According to a third aspect of the present invention, there is provided a carry-in method in which carry-in of a plate-like object onto a holding member having an object mounting surface provided on its upper surface is performed, the method comprising: carrying the object above the object mounting surface of the holding member at a predetermined carry-in position; suctioning a surface of the object from above by a suction member in a non-contact manner; supporting from below a part of a center section area at an other surface on an opposite side of the surface of the object suctioned by the suction member by a vertically movable support section provided at the holding member, and weakening a suction force by the suction member with respect to an area of the surface of the object corresponding to the center section area including a supporting point by the support section; and driving the suction member and the support section downward toward the object mounting surface, in a state maintaining a suction state by the suction member and a support state by the support section with respect to the object.

According to this method, it becomes possible to perform carry-in of the object onto the holding member in a state where the flatness degree of the object is highly maintained.

According to a fourth aspect of the present invention, there is provided a carrier system in which a plate-like object is carried, comprising: a holding member in which an object mounting surface is provided at its upper surface; a vertically movable suction member provided above the holding member at a predetermined carry-in position, the suction member being able to suction a plurality of places including at least an area at an outer circumference section of a surface of the object from above in a non-contact manner; a support section provided at the holding member, the support section being vertically movable and can support from below a part of the center section area at an other surface on an opposite side of the surface of the object; and a driving device which drives the suction member and the support section downward so that the other surface of the object moves toward the object mounting surface of the holding member, in a state where a suction state by the suction member and a support state by the support section with respect to the object is maintained.

According to this system, it becomes possible to perform carrier (carry-in) of the object onto the holding member in a state where the flatness degree of the object is highly maintained.

According to a fifth aspect of the present invention, there is provided a first exposure apparatus which forms a pattern on an object, comprising: the suction device related to any of the first and second aspects described above; and a pattern generating device in which the pattern is formed by exposing the object suctioned by the suction device and carried in on the holding member with an energy beam.

According to a sixth aspect of the present invention, there is provided a second exposure apparatus which forms a pattern on an object, comprising: the carrier system described above; and a pattern generating device in which the pattern is formed by exposing the object carried in on the holding member by the carrier system with an energy beam.

According to a seventh aspect of the present invention, there is provided a device manufacturing method, including: exposing an object using the exposure apparatus described above; and developing the object which has been exposed.

DESCRIPTION OF EMBODIMENTS

An embodiment will be described below, based on FIGS. 1 to 7.

Figure 1:
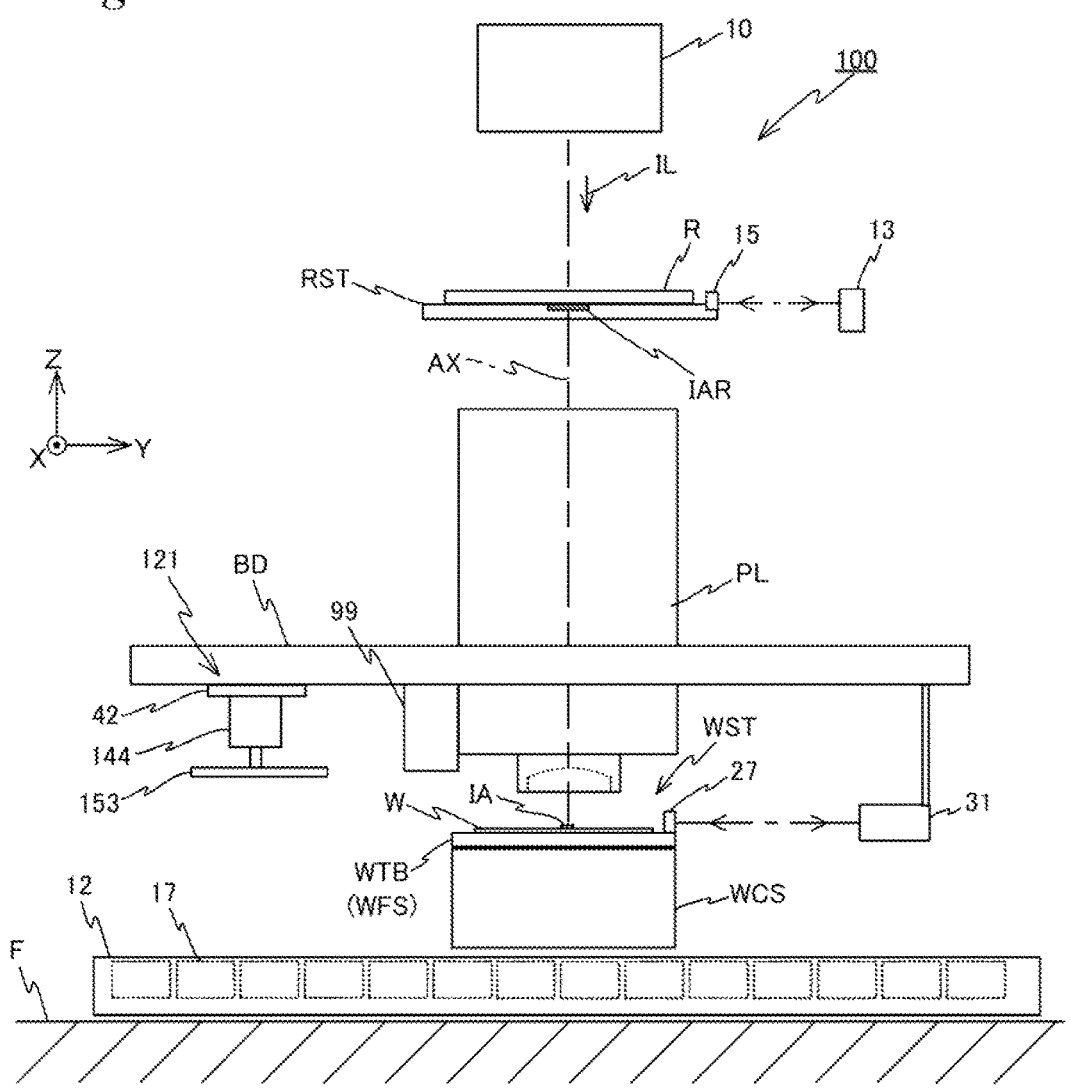
FIG. 1 is a view schematically showing a structure of an exposure apparatus related to an embodiment.

FIG. 1 schematically shows a structure of an exposure apparatus 100 related to an embodiment. This exposure apparatus 100 is a projection exposure apparatus of a step-and-scan method, or a so-called scanner. As it will be described later on, a projection optical system PL is arranged in the present embodiment, and in the description below, a direction parallel to an optical axis AX of this projection optical system PL will be described as a Z-axis direction, a direction within a plane orthogonal to the Z-axis direction in which a reticle R and a wafer W are relatively scanned will be described as the Y-axis direction, a direction orthogonal to the Z-axis and the Y-axis will be described as an X-axis direction, and rotational (inclination) direction around the X-axis, the Y-axis, and the Z-axis will be described as a θx direction, a θy direction, and a θz direction.

Exposure apparatus 100 is equipped with an illumination system 10, a reticle stage RST which holds reticle (mask) R, projection optical system PL, a wafer stage WST which holds wafer W, a carry-in unit 121 which structures a wafer carrier system 120 (refer to FIG. 4) along with a carry-out unit which is not shown and a vertical-motion pin which will be described later on, and a control system or the like of these parts.

Illumination system 10, as is disclosed in, for example, U.S. Patent Application Publication. No. 2003/0025890 and the like, includes a light source, an illuminance equalizing optical system including an optical integrator and the like, and an illumination optical system that has a reticle blind and the like (none of which are shown). Illumination system 10 illuminates a slit-shaped illumination area TAR set (limited) on reticle R by the reticle blind (also called a masking system) by an illumination light (exposure light) IL, with a substantially uniform illuminance. In this case, as illumination light IL, for example, an ArF excimer laser beam (wavelength 193 nm) is used.

On reticle stage RST, reticle R on which a circuit pattern or the like is formed on its pattern surface (the lower surface in FIG. 1) is fixed, for example, by vacuum chucking. Reticle stage RST, for example, is finely drivable within the XY plane by a reticle stage driving system 11 (not shown in FIG. 1, refer to FIG. 4) including a linear motor, a planar motor or the like, and is also drivable in a scanning direction (the Y-axis direction which is the lateral direction of the page surface in FIG. 1) at a predetermined scanning speed.

Position information (including rotation information in the θz direction) of reticle stage RST in the XY plane is constantly detected, for example, by a reticle laser interferometer (hereinafter, referred to as a "reticle interferometer") 13, via a movable mirror 15 (actually, a Y movable mirror (or a retroreflector) having a reflection surface orthogonal to the Y-axis direction and an X movable mirror having a reflection surface orthogonal to the X-axis direction are provided) fixed to reticle stage RST, at a resolution of, for example, around 0.25 nm. Measurement values of reticle interferometer 13 are sent to a main controller 20 (not shown in FIG. 1, refer to FIG. 4). Main controller 20 drives reticle stage RST via reticle stage driving system 11 (refer to FIG. 4), based on the position information of reticle stage RST. Incidentally, in the present embodiment, position information of reticle stage RST in the XY plane can be detected using an encoder, instead of the reticle interferometer described above.

Projection optical system PL is placed below reticle stage RST in FIG. 1. Projection optical system PL is mounted on a main frame BD supported horizontally by a support member which is not shown. Used as projection optical system PL, for example, is a dioptric system consisting of a plurality of optical elements (lens elements) arranged along optical axis AX, which is parallel to the Z-axis. Projection optical system PL, for example, is double telecentric, and has a predetermined projection magnification (for example, 1/4 times, 1/5 times or 1/8 times). Therefore, when illumination area IAR on reticle R is illuminated by illumination light IL from illumination system 10, a reduced image of the circuit pattern of reticle R (a reduced image of a part of the circuit pattern) within illumination area IAR is formed in an area (hereinafter, also called an exposure area) IA conjugate to illumination area IAR on wafer W whose surface is coated with a resist (sensitive agent) and is placed on a second surface (image plane) side of projection optical system PL, via projection optical system PL, by illumination light IL having passed through reticle R placed so that its pattern surface substantially coincides with a first surface (object plane) of projection optical system PL. And, by reticle stage RST and wafer stage WST (to be more precise, fine movement stage WFS to be described later on which holds wafer W) being synchronously driven, scanning exposure of a shot area (divided area) on wafer W is performed, by reticle R being relatively moved in the scanning direction (Y-axis direction) with respect to illumination area IAR (illumination light IL) and wafer W being relatively moved in the scanning direction (Y-axis direction) with respect to exposure area IA (illumination light IL), and the pattern of reticle R is transferred onto the shot area. That is, in the present embodiment, the pattern of reticle R is generated on wafer W by illumination system 10 and projection optical system PL, and by the exposure of the sensitive layer (resist layer) on wafer W with illumination light IL the pattern is formed on wafer W.

Wafer stage WST, as is shown in FIG. 1, is supported by levitation on base board 12, via air bearings which will be described later on. Here, base board 12 is supported almost horizontally (parallel to the XY plane) on a floor F by a vibration-proof mechanism (omitted in drawings). Base board 12 consists of a member that has a flat plate-like outer shape. Further, inside base board 12, a coil unit is housed, which includes a plurality of coils 17 placed in the shape of a matrix with the XY two-dimensional direction serving as a row direction and a column direction.

Figure 2:
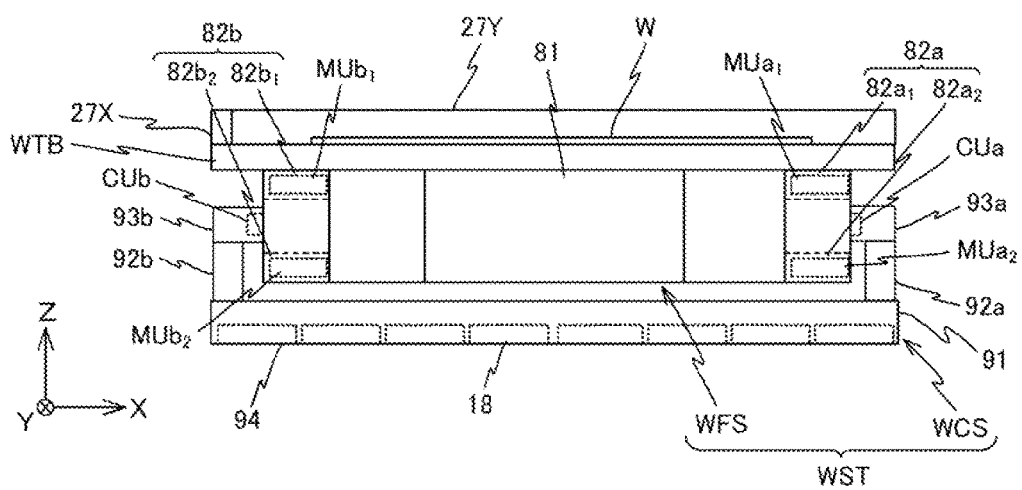
FIG. 2 is a view (front view) of a wafer stage in FIG. 1 when viewed from a −Y direction.

Wafer stage WST, as it can be seen from FIGS. 1 and 2, has a coarse movement stage WCS, and a fine movement stage WFS, which is supported in a non-contact state by coarse movement stage and is relatively movable with respect to coarse movement stage WCS. Here, wafer stage WST (coarse movement stage WCS) is driven in predetermined strokes in the X-axis direction and the Y-axis direction, and is also finely driven in the θz direction by a coarse movement stage driving system 51 (refer to FIG. 4). Further, fine movement stage WFS is driven in directions of six degrees of freedom (the X-axis direction, the Y-axis direction, the Z-axis direction, the θx direction, the θy direction and the θz direction) by a fine movement stage driving system 52 (refer to FIG. 4), with respect to coarse movement stage WCS.

Coarse movement stage WCS, as is shown in FIG. 2, is equipped with a coarse movement slider section 91 having a rectangular plate-like shape whose length in the X-axis direction is slightly longer than the length in the Y-axis direction in a planar view (when viewed from the +Z direction), a pair of side wall sections 92a, 92b, each having a rectangular plate-like shape with the longitudinal direction being the Y-axis direction, and being fixed on the upper surface of one end and the other end of coarse movement slider section 91 in the longitudinal direction in a state parallel to the YZ plane, and a pair of stator sections 93a, 93b fixed on the upper surface of side wall sections 92a, 92b, respectively, at the center in the Y-axis direction facing the inner side. Coarse movement stage WCS, as a whole, has a low height rectangular parallelepiped shape whose upper surface is open at the center in the X-axis direction and on both sides in the Y-axis direction. That is, in coarse movement stage WCS, a space section penetrating in the Y-axis direction is formed inside. Incidentally, side wall sections 92a, 92b can have almost the same length in the Y-axis direction as stator sections 93a, 93b. That is, side wall sections 92a, 92b may be provided only at the center in the Y-axis direction on the upper surface of coarse movement slider section 91, at one end and the other end in the longitudinal direction.

At the bottom surface of coarse movement stage WCS, that is, at the bottom surface of coarse movement slider section 91, a magnet unit corresponding to the coil unit placed inside base board 12 is provided, consisting of a plurality of permanent magnets 18 placed in the shape of a matrix with the XY two-dimensional directions serving as a row direction and the column direction. The magnet unit, along with the coil unit of base board 12, structures coarse movement stage driving system 51 (refer to FIG. 4) consisting of a planar motor of an electromagnetic force (Lorentz force) driving method whose details are disclosed, for example, in U.S. Pat. No. 5,196,745 and the like. The magnitude and direction of the electric current supplied to each coil 17 structuring the coil unit (refer to FIG. 1) are controlled by main controller 20.

At the bottom surface of coarse movement slider section 91, a plurality of air bearings 94 is fixed around the magnet unit described above. Coarse movement stage WCS is supported by levitation by the plurality of air bearings 94, via a predetermined gap (clearance, gap) above base board 12, such as for example, a gap of about several μm, and is driven in the X-axis direction, the Y-axis direction and the θz direction by coarse movement stage driving system 51.

Incidentally, coarse movement stage driving system 51 is not limited to the planar motor of the electromagnetic force (Lorentz force) driving method, and for example, a planar motor of a variable magneto-resistance driving method can also be used. Other than this, coarse movement stage driving system 51 can be structured by a magnetic levitation type planar motor, and the planar motor can driving coarse movement stage WCS in directions of six degrees of freedom. In this case, the air bearings will not have to be arranged at the bottom surface of coarse movement slider section 91.

Each of the pair of stator sections 93a, 93b, for example, consists of a member having an outer shape that is a rectangular plate shape, and inside each member, coil units CUa, CUb consisting of a plurality of coils are housed. The magnitude and direction of the electric current supplied to each coil structuring coil units CUa, CUb is controlled by main controller 20.

Fine movement stage WFS, as is shown in FIG. 2, for example, is equipped with a main section 81 consisting of a low-height columnar member having an octagonal shape in a planar view, a pair of mover sections 82a, 82b each fixed to one end and the other end in the X-axis direction of a main section 81, and a wafer table WTB consisting of a rectangular plate-shaped member when viewed from above, which is integrally fixed to the upper surface of main section 81.

Main section 81 is preferably made of a material having a thermal expansion coefficient is the same or around the same level as that of wafer table WTB, and the material is preferably a material having a low thermal expansion coefficient. Here, although it is omitted in the drawing in FIG. 2, at main section 81, a plurality of (for example, three) vertical-motion pins 140 (refer to FIG. 3B) being vertically movable is provided, which are inserted into through holes which are not shown formed in wafer table WTB (and in a wafer holder which is not shown). At the upper surface of each of the three vertical-motion pins 140, an exhaust opening 41 is formed for vacuum exhaust. Further, each of the three vertical-motion pins 140 has the lower end surface fixed to the upper surface of a platform member 141. Each of the three vertical-motion pins 140 is placed at a position which is almost the vertex of an equilateral triangle in a planar view on the upper surface of platform member 141. Exhaust opening 41 provided at each of the three vertical-motion pins 140 is connected to a vacuum pump (not shown), via an exhaust pipeline formed inside vertical-motion pin 140 (and platform member 141) and a vacuum exhaust piping which is not shown. Platform member 141 is connected to a driving device 142, via a shaft 143 fixed at the center of the lower surface. That is, the three vertical-motion pins 140 are driven in the vertical direction by driving device 142, integrally with platform member 141. In the present embodiment, platform member 141, the three vertical-motion pins 140 and shaft 143 structure a wafer support section 150, which can support from below a part of a center section area of the wafer lower surface. Here, displacement in the Z-axis direction from a reference position of the three vertical-motion pins 140 (wafer support section 150) is detected by a displacement sensor 145 (not shown in FIG. 3B, refer to FIG. 4), such as, for example, the encoder system provided at driving device 142. Main controller 20, based on measurement values of displacement sensor 145, drives the three vertical-motion pins 140 (wafer support section 150) in the vertical direction via driving device 142.

Referring back to FIG. 2, each of the pair of mover sections 82a, 82b has a housing whose YZ section is a rectangular frame shape, which is fixed, respectively, to a surface at one end and a surface at the other end in the X-axis direction of main section 81. Hereinafter, for the sake of convenience, the housings will be described as housings 82a, 82b using the same reference signs as mover sections 82a, 82b.

Housing 82a has a hollow section whose YZ section is a rectangular shape elongate in the Y-axis direction, with the Y-axis direction dimension (length) and the Z-axis direction dimension (height) both slightly longer than stator section 93a. In the hollow section of housings 82a, 82b, the end on the −X side of stator section 93a of coarse movement stage WCS is inserted in a non-contact manner. Inside an upper wall section $82a_1$ and a bottom wall section $82a_2$ of housing 82a, magnet units $MUa_1$, $MUa_2$ are provided.

Mover section 82b is structured in a similar manner, although the structure is symmetrical to mover section 82a. In the hollow section of housing (mover section) 82b, the end on the +X side of stator section 93b of coarse movement stage WCS is inserted in a non-contact manner. Inside an upper wall section $82b_1$ and bottom wall section $82b_2$ of housing 82b, magnet units $MUb_1$, $MUb_2$ are provided, which are structured similarly to magnet units $MUa_1$, $MUa_2$.

Coil units CUa, CUb described above are housed, respectively, inside stator sections 93a and 93b so that the units face magnet units $MUa_1$, $MUa_2$ and magnet units $MUb_1$, $MUb_2$.

The structure of magnet units $MUa_1$, $MUa_2$ and magnet units $MUb_1$, $MUb_2$, and coil units CUa, Cub, is disclosed in detail, for example, in U.S. Patent Application Publication No. 2010/0073652, U.S. Patent Application Publication No. 2010/0073653 and the like.

In the present embodiment, fine movement stage driving system 52 (refer to FIG. 4) in which fine movement stage WFS is supported by levitation in a non-contact state with respect to coarse movement stage WCS and is also driven in a non-contact manner in directions of six degrees of freedom is structured similarly to the U.S. Patent Application Publication No. 2010/0073652 and the U.S. Patent Application Publication No. 2010/0073653 described above, including the pair of magnet units $MUa_1$, $MUa_2$ that mover section 82a previously described has and coil unit CUa that stator section 93a has, and the pair of magnet units $MUb_1$, $MUb_2$ that mover section 82b has and coil unit CUb that stator section 93b has.

Incidentally, in the case of using a magnetic levitation type planar motor as coarse movement stage driving system 51 (refer to FIG. 4), because fine movement stage WFS can be finely driven in the Z-axis direction, the θx direction and the θy direction integrally with coarse movement stage WCS by the planar motor, fine movement stage driving system 52 can be structured so that fine movement stage WFS is drivable in the X-axis direction, the Y-axis direction and the θz direction, or that is, in directions of three degrees of freedom in the XY plane. Other than this, for example, to each of the pair of side wall sections 92a, 92b of coarse movement stage WCS, a pair of electromagnets each can be provided facing the oblique side of the octagonal shape of fine movement stage WFS, and facing each electromagnet a magnetic body member can be provided at fine movement stage WFS. With this arrangement, since fine movement stage WFS can be driven in the XY plane by the magnetic force of the electromagnet, this allows a pair of Y-axis linear motors to be structured by mover sections 82a, 82b and stator sections 93a, 93b.

In the center on the upper surface of wafer table, wafer W is fixed by vacuum chucking or the like via the wafer holder which is not shown such as a pin chuck. Further, on wafer table WTB, a movable mirror 27 (illustrated as movable mirrors 27X, 27Y in FIG. 2) which reflects the laser beam from a wafer laser interferometer (hereinafter referred to as a "wafer interferometer") 31 (refer to FIG. 1) is fixed, and by wafer interferometer 31 fixed to main frame BD in a suspended state, position of wafer table WTB in the XY plane is constantly detected, for example, at a resolution of around 0.25 to 1 nm. Here, actually, as is shown in FIG. 2, on wafer table WTB, movable mirror 27Y having a reflection surface orthogonal to the Y-axis direction which is the scanning direction and movable mirror 27X having a reflection surface orthogonal to the X-axis direction which is the non-scanning direction are provided, and wafer interferometer 31 is provided with one axis in the scanning direction and two axes in the non-scanning direction, however, in FIG. 1, these are representatively shown as movable mirror 27 and wafer interferometer 31. Position information (or velocity information) of wafer table WTB is sent to main controller 20. Main controller 20 controls the movement of wafer table WTB in the XY plane, via coarse movement stage driving system 51 and fine movement stage driving system 52, based on the position information (or velocity information). Incidentally, the position information of wafer table WTB in the XY plane can be detected using, for example, an encoder system in which a scale (diffractive grating) or a head is mounted on wafer table WTB, instead of wafer interferometer 31. Further, in the present embodiment, while wafer stage WST was a coarse fine movement stage equipped with coarse movement stage WCS and fine movement stage WFS, the present invention is not limited to this, and the wafer stage may be structured by a single stage which is movable in directions of six degrees of freedom.

Carry-in unit 121 is a unit for holding the wafer before exposure above the loading position prior to loading the wafer onto wafer table WTB and loading the wafer onto wafer table WTB. Further, the carry-out unit which is not shown is a unit for unloading the wafer after exposure from wafer table WTB.

Carry-in unit 121, as is shown in FIG. 1, is equipped with a chuck unit driving system 144 attached to main frame BD via an anti-vibration device 42, a chuck unit 153 and the like. Anti-vibration device 42 is a device for suppressing or preventing vibration generated at the time of driving chuck unit 153 by chuck unit driving system 144 from travelling to main frame BD, that is, for vibrationally separating chuck unit 153 from main frame BD. Accordingly, chuck unit driving system 144 and chuck unit 153 can be provided at another member, which is physically separate from main frame BD.

Figure 3A:
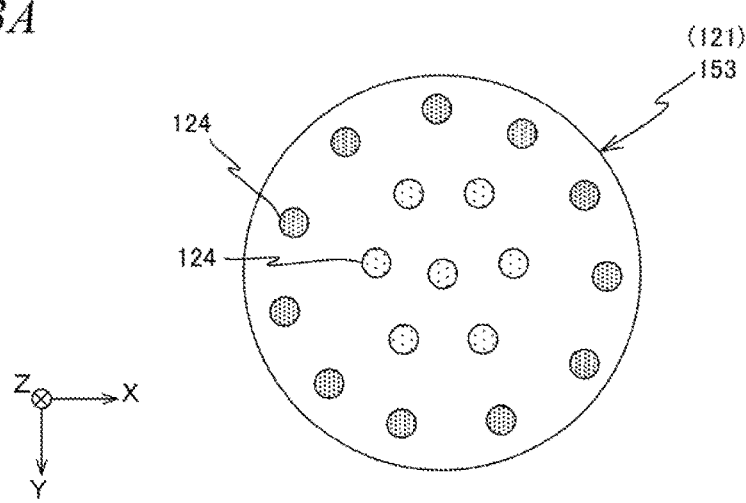
FIG. 3A is a bottom surface view which shows a carry-in unit (chuck unit) in FIG. 1.
Figure 3B:
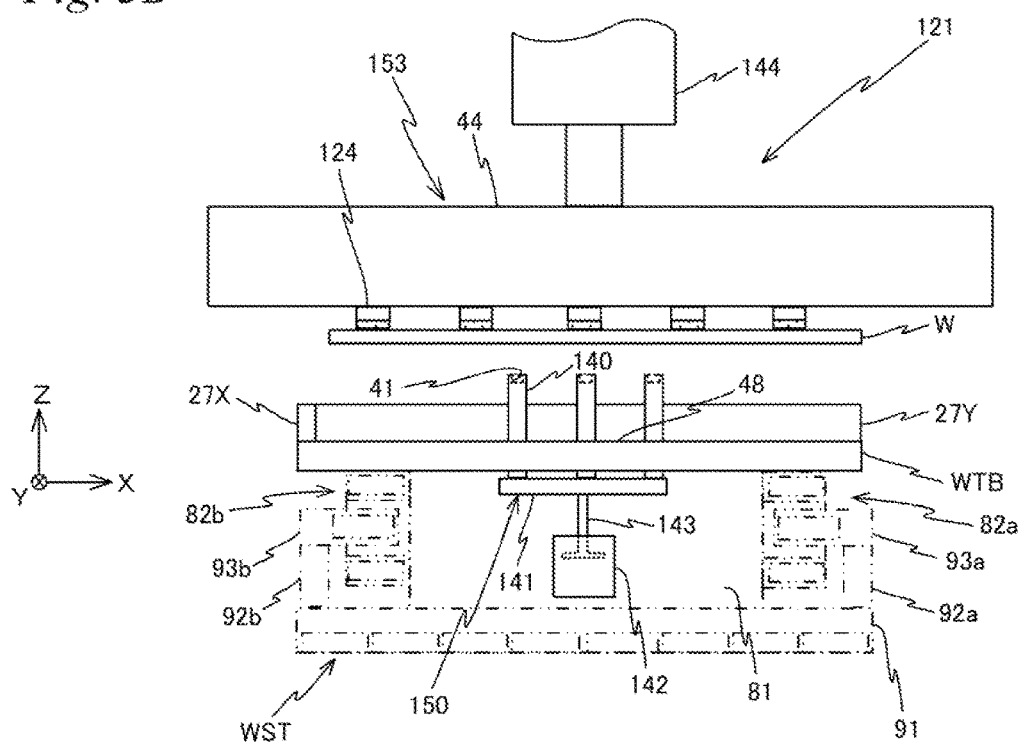
FIG. 3B is a view showing each part related to loading of a wafer and shows the carry-in unit, along with vertical-motion pins on the wafer stage and its driving device.

Chuck unit 153, as is shown in FIG. 3B, for example, is equipped with a plate member 44 of a predetermined thickness having a circular shape in a planar view, and a plurality of chuck members 124 fixed in a predetermined placement to the lower surface of plate member 44. Here, plate member 44 may also function as a cool plate in which piping and the like are provided inside, and by liquid controlled to a predetermined temperature flowing in the piping, the wafer is controlled to a predetermined temperature.

In the present embodiment, as is shown in FIG. 3a which is a planar view of chuck unit 153 when viewed from the −Z direction, at the lower surface of plate member 44 lower surface, seven chuck members 124 are placed at the center section area including the center point and at the outer periphery in a stat surrounding these seven chuck members 124, eleven chuck members 124 are placed. The six chuck members 124 that surround chuck member 124 positioned at the center point of the lower surface of plate member 44, are provided at positions substantially facing vertical-motion pins 140 when wafer stage WST is positioned at the loading position.

Each chuck member 124 consists of a so-called Bernoulli chuck. Bernoulli chuck, as is well known, is a chuck which uses the Bernoulli effect so that the flow velocity of the fluid blowing out (for example, air) is locally increased to suction (hold in a non-contact manner) the target object. Here, Bernoulli effect is an effect in which the pressure of the fluid decreases when the flow velocity increases, and with the Bernoulli chuck, the suction state (hold/levitation state) is determined by the weight of the target object to be suctioned (held, fixed), and the flow amount (flow velocity, pressure) of the fluid blown out from the chuck. That is, in the case the size of the target object is known, the size of the gap between the chuck and the target object to be held is determined according to the flow amount (flow velocity) of the fluid blown out from the chuck. In the present embodiment, chuck member 124 is used to suction wafer W, by blowing out gas from its gas flow holes (for example, a nozzle or a blowout port) and generating a flow of gas (gas flow) in the periphery of wafer W (refer to FIG. 3B). The degree of the force of suction (that is, the flow velocity and the like of the gas blown out) can be appropriately adjusted, and by suctioning wafer W with chuck member 124 and performing suction hold of the wafer, movement in the Z-axis direction, the θx direction and the θy direction can be restricted.

Figure 4:
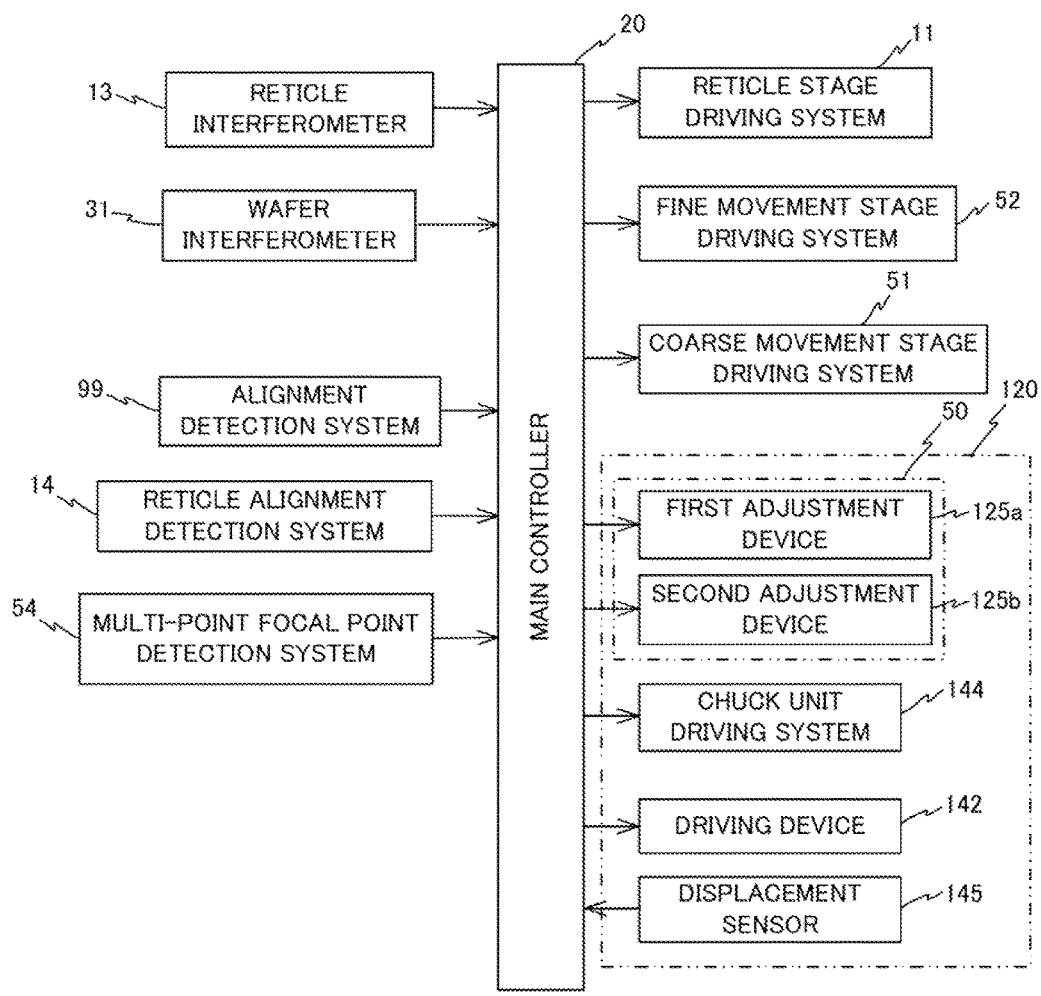
FIG. 4 is a block diagram showing an input/output relation of a main controller which mainly structures a control system of the exposure apparatus related to the embodiment.

Further, with the plurality of chuck members 124, flow velocity of the gas and the like blown out from each member is controlled by main controller 20, via a first adjustment device 125a or a second adjustment device 125b (refer to FIG. 4). This allows the suction force (adsorption force) of each chuck member 124 to be set to any value. In the present embodiment, the suction force of each chuck member 124 is controlled, via the first adjustment device 125a or the second adjustment device 125b (refer to FIG. 4) in groups. The first adjustment device 125a has a first fluid supply device which is not shown connected to the seven chuck members 124 placed at the center section area of the plate member 44 lower surface, and adjusts the suction force of the seven chuck members 124 (adjusts the flow velocity of the fluid (gas, for example, air) blown out from chuck member 124). Further, the second adjustment device 125b has a second fluid supply device which is not shown connected to the eleven chuck members 124 placed in the area excluding the center section area (that is, the outer circumference section) of the plate member 44 lower surface, and adjusts the suction force of the eleven chuck members 124. That is, in the present embodiment, a gas supply device 50 including the first adjustment device 125a and the second adjustment device 125b is structured, which supplies fluid (gas, for example, air) to the plurality of (in this case, 18) chuck members 124.

FIG. 3A shows chuck members 124 whose suction force is adjusted by the first adjustment device 125a and chuck members 124 whose suction force is adjusted by the second adjustment device 125b, classified by color. Incidentally, in the present embodiment, while the suction force of each chuck member is made adjustable by performing blowout of the fluid (gas) at a different flow velocity as a state different from each other in the plurality of chuck members, the embodiment is not limited to this. For example, the pressure of the fluid (gas) may be changed, or the flow amount may be changed. Further, a structure may also be employed in which the plurality of chuck members 124 are not grouped and the suction forces can be individually adjusted.

Chuck unit 153 is drivable in predetermined strokes in the Z-axis direction (in between a first position where wafer W carried in by a carrier arm 149 (refer to FIG. 5A) which is described later is suctioned and a second position where the suctioned wafer W is mounted on wafer table WTB), by chuck unit driving system 144 (refer to FIG. 3B). Chuck unit driving system 144 is controlled by main controller 20 (refer to FIG. 4).

Referring back to FIG. 1, on the −Y side of projection optical system PL, an off-axis alignment detection system 99 is provided. As alignment detection system 99, for example, an FIA (Field Image Alignment) system alignment sensor of an image processing method is used, which irradiates a broadband detection beam that is not sensitive to the resist on wafer W on the subject mark, picks up an image of the subject mark formed on the light-receiving plane by the reflected light from the subject mark and an index image not shown using an imaging element (CCD) or the like, and outputs the imaging signals. The imaging results of this alignment detection system 99 are sent to main controller 20.

Although it is not shown in FIG. 1, above reticle R, a pair of reticle alignment detection systems 14 (refer to FIG. 4) of a TTR (Through The Reticle) method is placed that uses an exposure wavelength to simultaneously observe a pair of reticle alignment marks on reticle R and an image via projection optical system PL of a pair of first reference marks on a reference mark plate which is not shown on wafer table WTB corresponding to the reticle alignment marks. Detection signals of the pair of reticle alignment detection systems 14 are supplied to main controller 20.

Other than this, in exposure apparatus 100, a multi-point focal point detection system 54 (refer to FIG. 4) is provided, consisting of an irradiation system and a light-receiving system which are placed with alignment detection system 99 in between, and being structured in a similar manner as the system disclosed in, for example, U.S. Pat. No. 5,448,332 and the like.

FIG. 4 shows a block diagram illustrating an input/output relation of control main controller 20, which mainly structures the control system of exposure apparatus 100 and has overall control over each section. Main controller 20 includes a work station (or a microcomputer) or the like, and has overall control over each section of exposure apparatus 100.

In exposure apparatus 100 related to the present embodiment structured in the manner described above, first of all, reticle loading is performed by a reticle loader under the control of main controller 20. Next, by main controller 20, preparatory operations such as base line measurement of alignment detection system 99 are performed according to a predetermined procedure, using the pair of reticle alignment detection systems 14 (refer to FIG. 4), the reference mark plate (not shown) on wafer stage WST, and alignment detection system 99 (refer to FIGS. 1 and 4) and the like. Loading of the wafer is performed after these preparatory operations.

Now, the procedure of loading of wafer W will be described based on FIGS. 5A to 6C. As a premise, chuck unit driving system 144 is to be driven by main controller 20, and chuck unit 153 is to be moved to a position (waiting position) at a predetermined height within the stroke range and to be waiting at this position.

Figure 5A:
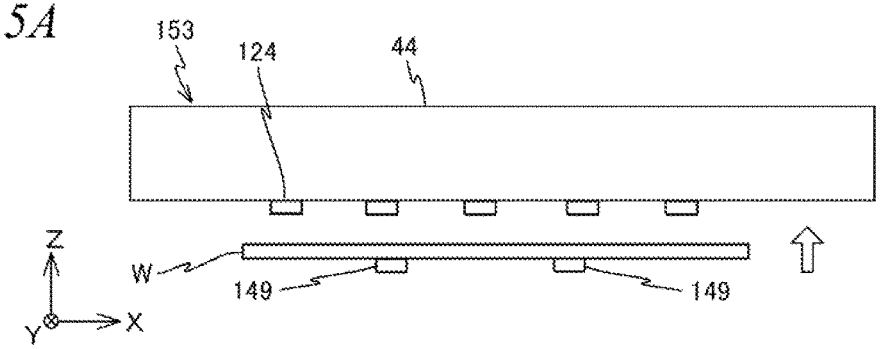
FIGS. 5A to 5D are views (No. 1 to No. 4) used for explaining a carry-in procedure of the wafer.

In this state, first of all, as is shown in FIG. 5A, carrier arm 149 holding wafer W under the control of main controller 20 is moved to a position under chuck unit 153. That is, wafer W is carried to a position below chuck unit 153 by carrier arm 149. Next, as is shown by the outlined arrow in FIG. 5A, carrier arm 149 holding wafer W moves upward by a predetermined amount. On this operation, a high-pressure air flow is made to blow out from all the chuck members 124 of chuck unit 153, via each gas flow hole.

Figure 5B:
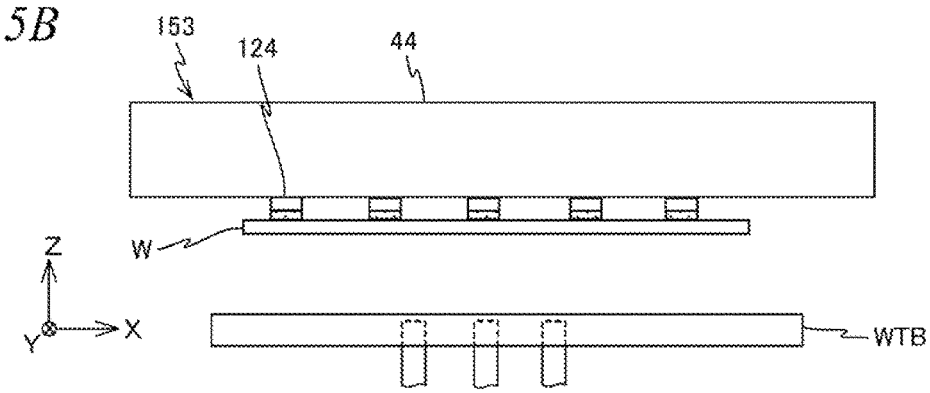

Then, when carrier arm 149 is moved upward by a predetermined amount, as is shown in FIG. 5B, the upper surface of wafer W is suctioned in a non-contact manner by all the chuck members 124 of chuck unit 153. Next, main controller 20 withdraws carrier arm 149 from under wafer W, after separating carrier arm 149 and wafer W. By this operation, wafer W moves to a state suctioned in a non-contact manner by chuck unit 153 located at a predetermined height position (waiting position) at the loading position. On this operation, while wafer W is in a state held by chuck unit 153 where its movement is restricted in the Z-axis direction, the ex direction, and the θy direction by the suction of chuck unit 153, another member for holding wafer W may be prepared so that chuck unit 153 provides only the suction force (a force which can perform suction but not holding) to wafer W.

In this state, main controller 20 drives wafer stage WST via coarse movement stage driving system 51 (refer to FIG. 4) to t position under wafer W held by chuck unit 153. FIG. 5B shows wafer table WTB in the state after this movement of wafer stage WST.

Figure 5C:
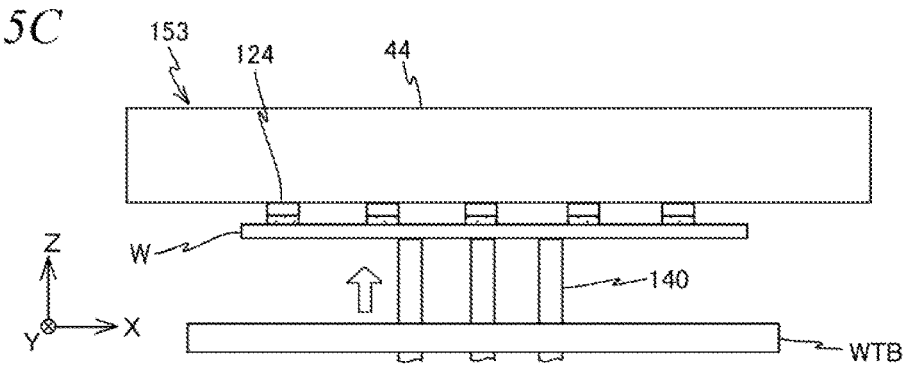

Next, main controller 20, as is shown in FIG. 5C, drives the three vertical-motion pins 140 (wafer support section 150) on wafer stage WST (refer to FIG. 3B) upward, via driving device 142. Then, when the three vertical-motion pins 140 come into contact with the lower surface of wafer W suctioned by chuck unit 153, main controller 20 stops the upward drive of wafer support section 150. Here, the Z position of wafer W suctioned by chuck unit 153 located at the waiting position can be obtained accurately to some extent. Accordingly, by driving wafer support section 150 by a predetermined amount from the reference position based on the measurement results of displacement sensor 145, main controller 20 can make the three vertical-motion pins 140 come into contact with the lower surface of wafer W suctioned by chuck unit 153. However, the arrangement is not limited to this, and it can be set in advance so that the three vertical-motion pins 140 come into contact with the lower surface of wafer W suctioned by chuck unit 153 at the upper limit of the movement position of wafer support section 150 (the three vertical-motion pins 140).

Then, main controller 20 operates a vacuum pump which is not shown, and begins the vacuum chucking with respect to the wafer W lower surface by the three vertical-motion pins 140. Incidentally, suction (holding) of wafer W by chuck member 124 is still being continued in this state. Movement of wafer W is restricted by the suction by chuck member 124 and a frictional force by the support from below of vertical-motion pins 140, in directions of six degrees of freedom.

Figure 5D:
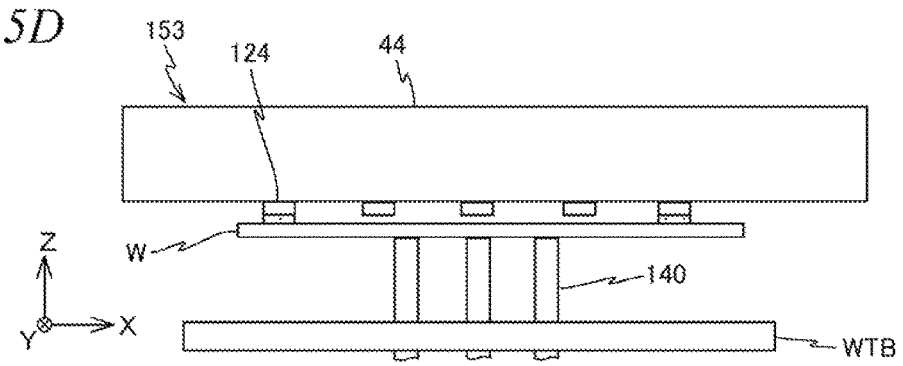

When wafer W is supported (suction hold is performed) by the three vertical-motion pins 140, as is shown in FIG. 5D, main controller 20 releases the suction of wafer W by the seven chuck members 124 by stopping the outflow of the high-pressure air flow from the seven chuck members 124 at the center section area, via the first adjustment device 125a (refer to FIG. 4). This is because when suction hold (support) by the three vertical-motion pins 140 from below and suction by chuck unit 153 from above is performed with respect to wafer W as is shown in FIG. 5C, partial surplus-restraint may occur in wafer W. When a downward synchronous drive of chuck unit 153 and wafer support section 150 (the three vertical-motion pins 140) to load wafer W onto wafer table WTB is performed in the manner described below in this partially surplus state, in the case the chuck unit and the wafer support section lose synchronization, warping may occur in wafer W. Therefore, to prevent such a situation from occurring, the suction of wafer W by the seven chuck members 124 was released.

Figure 6A:
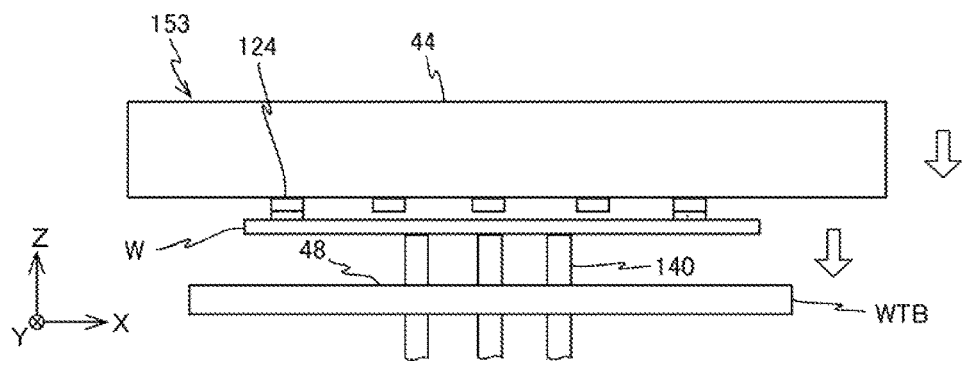
FIGS. 6A to 6c are views (No. 5 to No. 7) used for explaining the carry-in procedure of the wafer.

Next, main controller 20, as is shown in FIG. 6A, synchronously drives chuck unit 153 and the three vertical-motion pins 140 (wafer support section 150) downward, via chuck unit driving system 144 and driving device 142. By this operation, chuck unit 153 and the three vertical-motion pins 140 (wafer support section 150) are synchronously driven downward, while maintaining the suction (hold) state by chuck unit 153 (chuck member 124) and the support state by the three vertical-motion pins 140 with respect to wafer W. This drive of chuck unit 153 and the three vertical-motion pins 140 (wafer support section 150) is performed until the lower surface (rear surface) of wafer W comes into contact with a planar wafer mounting surface 48 of wafer table WTB (refer to FIG. 6B). Here, although wafer mounting surface 48 is actually a virtual flat plane (area) formed by the upper end surface of multiple pins that the pin chuck provided on wafer table WTB has, FIG. 3B and the like illustrates the upper surface of wafer table WTB serving as wafer mounting surface 48.

Figure 6B:
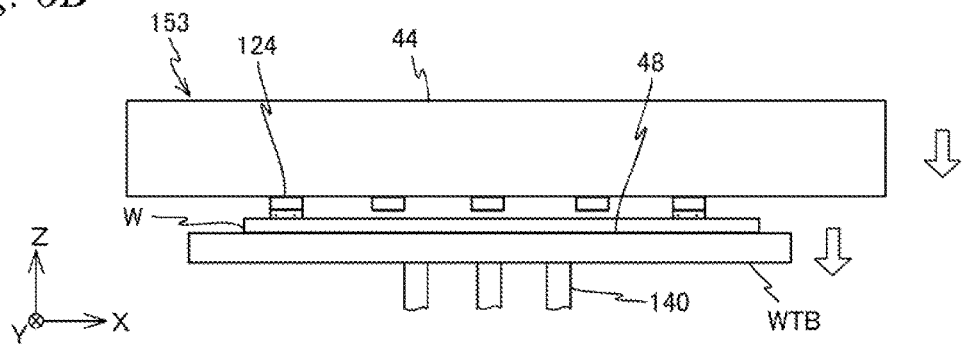
Figure 6C:
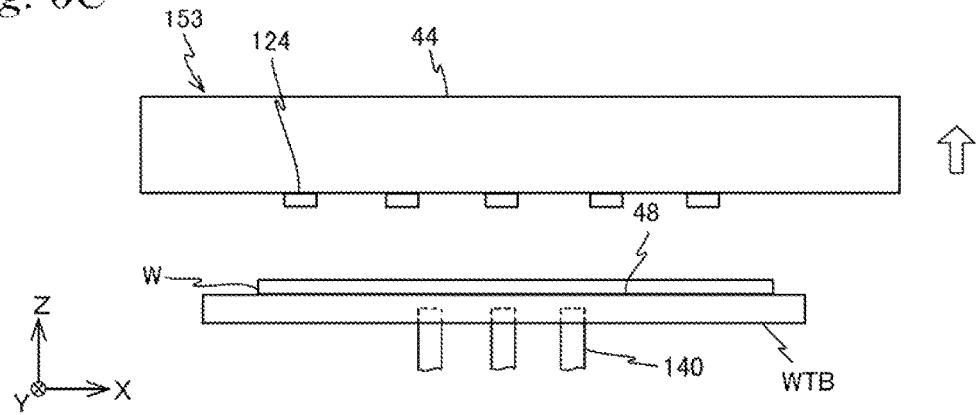

Then, when the lower surface of wafer W comes into contact with the wafer table WTB upper surface (wafer mounting surface 48) as is shown in FIG. 6B, main controller 20 stops the outflow of the high-pressure air flow from the eleven chuck members 124 at the outer circumference section via second adjustment device 125b, and after the suction of wafer W by all chuck members 124 has been released, begins the adsorption of wafer W by the wafer holder which is not shown on wafer table WTB. Next, main controller 20 drives chuck unit 153 upward to the waiting position previously described, via chuck unit driving system 144, as is shown in FIG. 6C. This completes the loading (carry-in) of wafer W onto wafer table WTB. Further, the adsorption (suction) of wafer W by the wafer holder may be started before the lower surface of wafer W comes into contact with the wafer table WTB upper surface (wafer mounting surface 48). In such a case, the suction of wafer W by all or a part of chuck member 124 may be released before the lower surface of wafer W comes into contact with the wafer table WTB upper surface (wafer mounting surface 48).

After the loading of wafer W described above, alignment measurement (wafer alignment) such as EGA (Enhanced Global Alignment) is executed by main controller 20, using alignment detection system 99.

After the alignment measurement has been completed, exposure operation by the step-and-scan method is performed as is described below. On the exposure operation, first of all, wafer stage WST (wafer table WTB) is moved so that the XY position of wafer W is at a scanning starting position (acceleration starting position) for exposure of the first shot area (first shot) on wafer W. Simultaneously, reticle stage RST is moved so that the XY position of reticle R is at a scanning starting position. Then, scanning exposure is performed by main controller 20 synchronously moving reticle R and wafer W, via reticle stage driving system 11, coarse movement stage driving system 51 and fine movement stage driving system 52, based on position information of reticle R measured by reticle interferometer 13 and position information of wafer W measured by wafer interferometer 31. During the scanning exposure, by main controller 20, focus leveling control is performed, in which fine movement stage WFS is finely driven in the Z-axis direction, the θx direction and the θy direction based on measurement results of multi-point focal point detection system 54, so that the irradiation area (exposure area) of illumination light IL of wafer W is made to coincide within the range of the depth of focus of the image plane of projection optical system PL.

When transfer of the reticle pattern with respect to a shot area is completed in this manner, stepping of wafer table WTB is performed by one shot area, and scanning exposure is performed with respect to the next shot area. In this manner, the stepping and the scanning exposure are sequentially repeated, so that the pattern of reticle R is overlaid and transferred to a predetermined number of shot areas on wafer W.

As is described so far, according to exposure apparatus 100 related to the present embodiment, on loading wafer W on wafer table WTB via chuck unit 153 and the three vertical-motion pins 140, main controller 20 at first secures the flatness of wafer W by making the suction force of all chuck members 124 of chuck unit 153 act simultaneously on the upper surface of wafer W, and in a state maintaining the flatness, decreases the suction force by the seven chuck members 124 that suctions the center section area of the wafer W upper surface to zero at the stage where wafer W is supported (suction hold) from below by the three vertical-motion pins 140. By this operation, the surplus-restraint in which wafer W receives forces from both side surfaces in the vertical direction of chuck unit 153 and vertical-motion pins 140 is prevented. Then, by chuck unit 153 and vertical-motion pins 140 being synchronously driven downward while the suction state by chuck unit 153 (chuck member 124) and the support state by the three vertical-motion pins 140 are maintained, the entire surface of the rear surface of wafer W almost simultaneously or in the order of the center of the rear surface toward the outer circumference section comes into contact with wafer mounting surface 48, and it becomes possible to load wafer W onto wafer table WTB in a state where there is no warping (a state in which the flatness degree is high).

Further, according to exposure apparatus 100 related to the present embodiment, because exposure is performed in a stepping-and-scanning method with respect to wafer W loaded on wafer table WTB in a state where the flatness degree is high, exposure without defocus to each of a plurality of shot areas on wafer W becomes possible, which allows the pattern of reticle R to be transferred favorably onto the plurality of shot areas.

Incidentally, in the embodiment above, the suction force of a plurality of (for example, eighteen) chuck members 124 was controlled for each group via the first adjustment device 125a or the second adjustment device 125b (refer to FIG. 4), the groups being the seven first groups placed in the center area of plate member 44 lower surface and the eleven second groups placed at the outer circumference section. However, the embodiment is not limited to this, and a structure can be employed in which the suction force of the plurality of (for example, eighteen) chuck members 124 can be set individually and arbitrarily. In this case, a design value of the suction force (that is, flow velocity of the fluid or the like blown out from chuck member 124) and the placement of each of the plurality of chuck members 124 may be obtained in advance by fluid analysis, experiment or the like so that the suction force of the plurality of chuck members 124 with respect to wafer W becomes an optimal value (a value which does not generate warping caused by the surplus-restraint with respect to wafer W, and also a value which can secure a desired flatness degree of wafer W) corresponding to the position of each chuck member 124.

Figure 7:
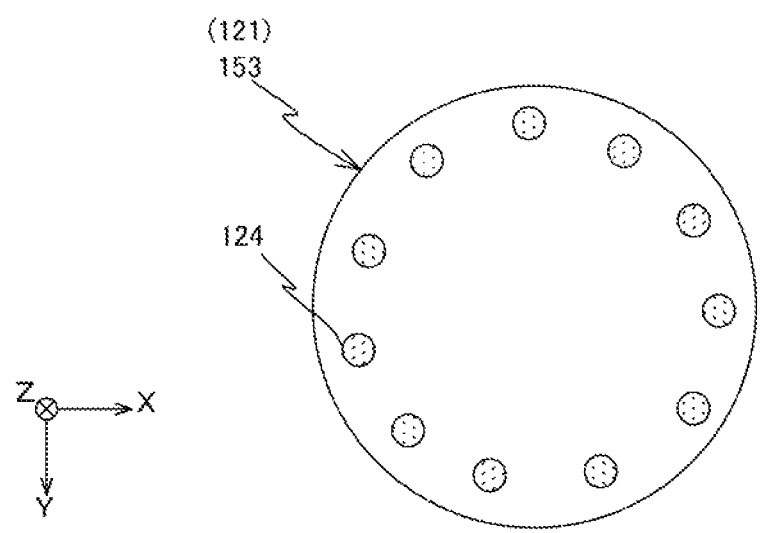
FIG. 7 is a view used for explaining another example of an arrangement of chuck members provided in the chuck unit.

Further, in the embodiment described above, while the case has been described where chuck members 124 were placed almost on the entire surface of the lower surface of plate member 44 of chuck unit 153, the embodiment is not limited this, and for example, as is shown in FIG. 7, in the embodiment described above only the chuck members 124 placed at the outer circumference section on the lower surface of plate member 44 whose suction force is adjusted by the second adjustment device 125b may be set. As a matter of course, in the case, the first adjustment device 125a is not necessary. Such a structure is suitable in a case when it is obvious that a desired flatness degree level of wafer W can be secured by only the chuck members 124 placed at the outer circumference section on the lower surface of plate member 44. In the case of the structure shown in FIG. 7, as long as chuck unit 153 and vertical-motion pins 140 are driven downward synchronously, there is almost no possibility that the periphery section at the rear surface of wafer W will come into contact with wafer mounting surface 48 before the center section. Alternately, wafer W can be made so that the desired level of flatness degree is secured by chuck members 124 and the three vertical-motion pins 140. In this case, for example, by adjusting the driving velocity of chuck unit driving system 144 and driving device 142 while monitoring the flatness degree of the wafer, it is possible to make wafer W have the desired level of flatness degree.

Further, in the embodiment described above, while the suction force of the seven chuck members 124 placed at the center section on the lower surface of plate member 44 was totally reduced to zero via the first adjustment device 125a at the stage where wafer W was supported from below by the three vertical-motion pins 140, the embodiment is not limited to this, and the suction force of the seven chuck members 124 can be weakened (reduced), or the suction force of a part of the chuck members 124 of the seven chuck members 124 can be weakened (or reduced to zero).

Incidentally, in the embodiment described above, the first adjustment device 125a may be structured so that the suction force of the plurality of (seven) chuck members 124 is adjustable individually, or in groups which are decided in advance. Similarly, the second adjustment device 125b may be structured so that the suction force of the plurality of (eleven) chuck members 124 is adjustable individually, or in groups which are decided in advance.

Incidentally, in exposure apparatus 100 related to the embodiment described above, in the case plate member 44 of chuck unit 153 also functions as a cool plate, chuck unit 153 may wait in a state suctioning the wafer subject to the next exposure at the waiting position of the predetermined height above the loading position while exposure with respect to wafer W on wafer stage WST is being performed. In this case, wafer W can be controlled to a predetermined temperature even during the waiting.

Now, in exposure apparatus 100 related to the embodiment described above, when wafer W is loaded onto wafer table WTB, chuck unit 153 and the three vertical-motion pins 140 (wafer support section 150) are driven downward synchronously (refer to FIGS. 6A and 6B) while the suction state by chuck unit 153 (chuck member 124) and the support state by the three vertical-motion pins 140 with respect to wafer W are maintained. On this operation, if chuck unit 153 and the three vertical-motion pins 140 (wafer support section 150) lose synchronization on the drive and the latter is driven downward before the former, a driving force in the −Z direction by driving device 142 may act on the area adsorbed by the three vertical-motion pins 140 in the center of the lower surface of wafer W, which may cause the center section area of wafer W to deform (warp) in a downward protruded shape. In this case, while it can be considered to set the suction force of the seven chuck members placed at the center section area not to zero but to a predetermined value, and to provide the suction force to wafer W as an upward force opposing the driving force in the −Z direction described above, in such a way, it is as previously described that a surplus-restraint state will occur in wafer W.

A First Modified Example of Vertical-motion Pins

Figure 8:
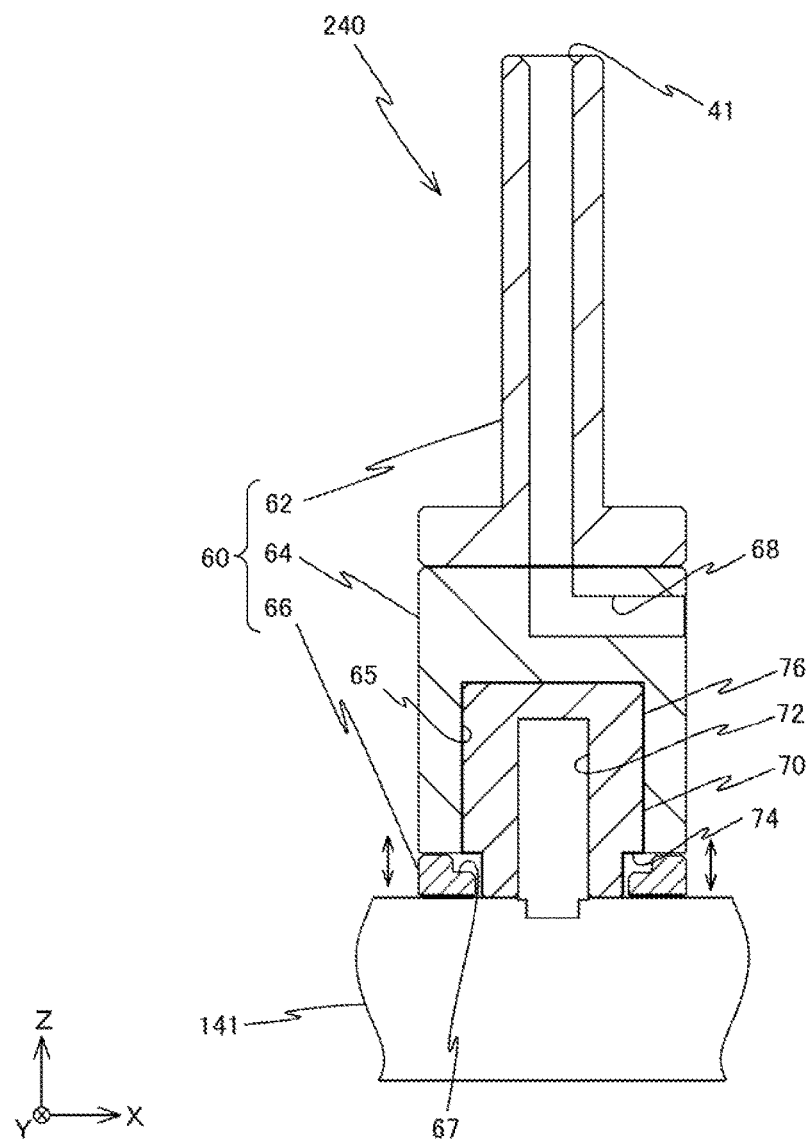
FIG. 8 is a view showing a structure of a vertical-motion pin related to a first modified example.

Therefore, in order to restrain deformation to a downward protruded shape of the center section of wafer W described above, for example, instead of each of the three vertical-motion pins 140 previously described, for example, a vertical-motion pin 240 related to a first modified example having a structure as is shown in a sectional view in FIG. 8, can be arranged on the upper surface of platform member 141.

Vertical-motion pin 240, as is shown in FIG. 8, is equipped with an shaft member 70 fixed to the upper surface of platform member 141, and a suspended member 60 which is attached slidable in the vertical direction with respect to shaft member 70 and has a recess section 65 of a predetermined depth formed on a surface opposing platform member 141.

Suspended member 60, as is shown in FIG. 8, is equipped with a support section 62, a slide section 64 and a stopper section 66.

Support section 62 consists of a stepped rod-shaped member whose lower end is slightly thicker than other parts. Slide section 64 consists of a cylindrical (columnar) member which has a sectional shape when overlapping in a planar view the same with the lower end of support section 62. Slide section 64 has a recess section of a predetermined depth, for example, whose sectional shape is circular, formed in the lower end surface. Slide section 64 and support section 62 are integrated by fixing the lower end surface of support section 62 to the upper surface of slide section 64. Integration of slide section 64 and support section 62 is performed, for example, by bolting, by adhering or the like.

In support section 62 and slide section 64, an exhaust pipeline 68 is provided which runs from an exhaust opening 41 formed at the upper end surface of support section 62, passes through the inside of support section 62, furthermore passes through the inside of slide section 64, and opens at the outer circumference surface of slide section 64. To the opening on the opposite side of exhaust opening 41 of exhaust pipeline 68, one end of a vacuum piping is connected that has the other end connected to a vacuum pump which is not shown.

Stopper section 66 consists of a ring-shaped member that has an outer circumferential surface substantially flush with the outer circumferential surface of slide section 64 and an inner circumferential surface that protrudes slightly inward than the inner circumferential surface of inner slide section 64, and on the inner circumferential side of its upper surface, a step section 67 is formed. Stopper section 66 and slide section 64 are integrated by stopper section 66 being fixed to the lower end surface of slide section 64. Integration of stopper section 66 and slide section 64 is performed, for example, by bolting, by adhering or the like. Incidentally, while support section 62, slide section 64, and stopper section 66 can be formed as separate members and then be integrated into suspended member 60, at least two parts can be integrally formed.

Shaft member 70 consists of a stepped columnar member in which a part of the lower end has a diameter smaller than other parts. The outer diameter of the large diameter section of shaft member 70 is slightly smaller than the inner diameter of the recess section of slide section 64, for example, by several μm to several tens of μm. Further, the outer diameter of the small diameter section of shaft member 70 is smaller by around several mms than the inner diameter of stopper section 66. The dimension in the height direction of shaft member 70 is a dimension in which the upper end surface of suspended member 60 is almost in contact with the bottom surface of the recess section of slide section 64, in a state where suspended member 60 is in contact with the platform member 141.

At the bottom surface (lower surface) of shaft member 70, a space 72 having a circular sectional shape of a predetermined depth is formed in the center section. In shaft member 70, a plurality of penetrating holes not shown that communicate with the outer circumferential surface from space are formed in a radial placement, at different height positions of the shaft member, To space 72, a gas supply device (for example, a compressor) which is not shown is connected, via a gas supply pipeline and a gas supply pipe which are not shown.

The supply amount or the like of gas (for example, compressed air) into space 72 by the gas supply device which is not shown is controlled by main controller 20. Here, when the compressed air is supplied into space 72, the compressed air is made to blow out from between the outer circumferential surface of shaft member 70 and the inner circumferential surface of slide section 64, via a plurality of penetrating holes which are not shown formed in the side wall of shaft member 70. That is, an air static pressure bearing (air bearing) 76 is formed in between shaft member 70 and slide section 64. Incidentally, in the description below, the outer circumferential surface of shaft member 70 (the inner circumferential surface of slide section 64) will be referred to as a guide surface 76, using the same reference sign as air bearing 76.

In the section at the border of the large diameter section and the small diameter section of shaft member 70, as is shown in FIG. 8, a step section 74 is formed. Step section 67 of stopper section 66 is placed to face this step section 74. A predetermined gap (gap) exists in between the opposing surfaces of step section 74 and step section 67. In strokes corresponding to the size of this gap, suspended member 60 is drivable along guide surface 76 with respect to shaft member 70. Strokes in the vertical direction of suspended member 60 are restricted by stopper section 66. Meanwhile, movement of suspended member 60 in the horizontal plane is restricted (restrained) by shaft member 70. Incidentally, since stopper section 66 only has to restrict the strokes in the vertical direction of suspended member 60, stopper section 66 does not necessarily have to be annular.

In the exposure apparatus equipped with wafer stage WST that has a wafer support section having three vertical-motion pins 240 with the structure described above provided on the upper surface of platform member 141, loading of wafer W onto wafer table WTB is performed in a procedure similar to the embodiment described above.

On this operation, in the state immediately after supporting wafer W suctioned in a non-contact manner by chuck unit 153 (chuck member 124) corresponding to FIGS. 5C and 5D from below by the three vertical-motion pins 240, suspended member 60 of vertical-motion pin 240, as is shown in FIG. 8, is positioned at the lowest end position (movement lower limit position) within the stroke range.

Next, wafer W is driven downward along with chuck unit 153 and vertical-motion pins 240, while maintaining the predetermined gap with respect to chuck unit 153 (chuck member 124). On this operation, due to the difference of driving responsiveness between chuck unit 153 and vertical-motion pins 240, vertical-motion pins 240 may be driven downward before chuck unit 153. In this case, immediately after the beginning of the drive, shaft member 70 is driven along guide surface 76 downward with respect to slide section 64 within a range of predetermined strokes, in a state where the position of suspended member 60 is maintained. Then, when step section 74 of shaft member 70 hits step section 67 of stopper section 66, suspended member 60 will also be driven downward by driving device 142, along with shaft member 70. Accordingly, if the downward movement of chuck unit 153 synchronous with the three vertical-motion pins 240 begins by the time step section 74 of shaft member 70 hits step section 67 of stopper section 66, generation of deformation (flexure) previously described to a downward protruded shape of the center section of wafer W due to the action of the driving force in the –Z direction caused by driving device 142 can be suppressed.

Meanwhile, in case the responsiveness of chuck unit 153 is superior to the responsiveness of vertical-motion pins 240 and chuck unit 153 begins to move downward earlier on the synchronous drive, prior to starting the downward movement of chuck unit 153 immediately after wafer W suctioned in a non-contact manner by chuck unit 153 (chuck member 124) is supported from below by the three vertical-motion pins 240, shaft member 70 is positioned to the movement lower limit position where step section 74 hits the step section 67 of stopper section 66. This allows the generation of deformation (flexure) to an upward protruded shape of the center section of wafer W to be restrained.

Now, in the exposure apparatus equipped with wafer stage WST having the wafer support section described above related to the first modified example with the three vertical-motion pins 240 provided on the upper surface of platform member 141, deformation to a downward protruded shape (or an upward protruded shape) of the center section of wafer W caused by the difference of responsiveness described above between chuck unit 153 and vertical-motion pins 240 can be restrained. However, the self-weight of suspended member 60 acts as a force in a downward direction with respect to wafer W. Therefore, instead of vertical-motion pins 140 or vertical-motion pins 240, a vertical-motion pin 340 related to a second modified example below can also be used.

A Second Modified Example of Vertical-motion Pins

Figure 9:
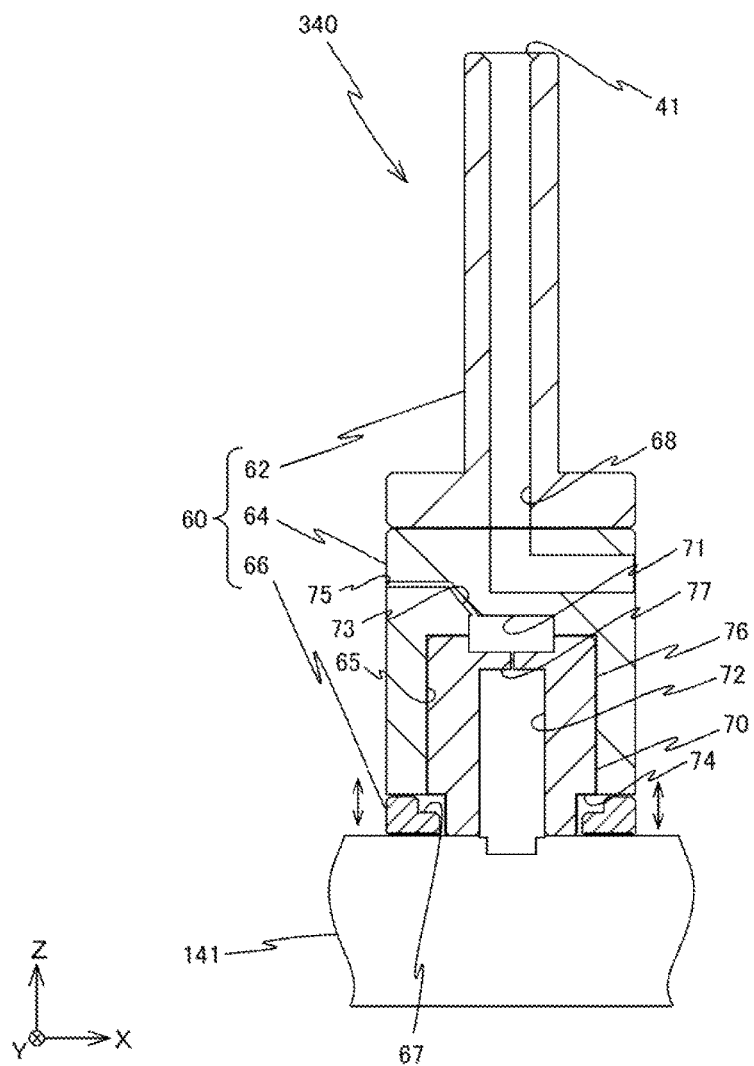
FIG. 9 is a view showing a structure of a vertical-motion pin related to a second modified example.

Vertical-motion pin 340 related to a second modified example, as is shown in FIG. 9, is basically structured in a similar manner as vertical-motion pin 240 previously described, however, the following points are different. That is, as is shown in FIG. 9, vertical-motion pin 340 has an air chamber 71 and an exhaust hole 75 formed inside which are the points different from vertical-motion pin 240, and since other structures and functions are the same as in the first modified example, the description thereabout will be omitted.

As is shown in FIG. 9, air chamber 71 is formed inside vertical-motion pin 340 (to be more precise, in between slide section 64 and shaft member 70). Air chamber 71 communicates with space 72, via an air flow passage 77 formed below. Therefore, a part of compressed air supplied into space 72 via a gas supply device which is not shown passes through air flow passage 77 and flows into air chamber 71. That is, the pressure in air chamber 71 is higher (positive pressure) when compared with the pressure in the space where vertical-motion pin 340 is placed, and a force in an upward direction is applied to suspended member 60. Here, by controlling the gas supply device so that the upward force by the compressed air flowing into air chamber 71 is balanced with the downward force in the vertical direction by the self-weight of suspended member 60, it can prevent the self-weight of suspended member 60 from acting as a downward force with respect to wafer W.

Exhaust hole 75 consists of an opening formed near the upper end of the side surface of slide section 64 (the side surface on the −X side in FIG. 9), and communicates with air chamber 71 via air flow passage 73. That is, a part of the compressed air flowing into air chamber 71 is constantly exhausted from exhaust hole 75.

As is described so far, in the exposure apparatus that is equipped with wafer stage WST having a wafer support section in which three vertical-motion pins 340 of the structure described above are provided on the upper surface of platform member 141, other than being able to obtain the same effect as the exposure apparatus equipped with the three vertical-motion pins 240 described above, by making the pressure inside air chamber 71 be positive an upward force equal to its self-weight is applied to suspended member 60, which can prevent deformation occurring to wafer W by the self-weight of suspended member 60 when suspended member 60 is suspended from the wafer W lower surface. That is, wafer W is mounted on wafer table WTB in a state where wafer W has a higher degree of flatness.

Further, since exhaust hole 75 is formed communicating with air chamber 71, vertical-motion pin 340 serves as a damper due to viscous resistance of air such as when wafer W held by suction by wafer table WTB is separated from wafer table WTB by being pushed from below by vertical-motion pin 340, which can prevent wafer W from vibrating (jumping).

Other than this, instead of vertical-motion pin 140, a vertical-motion pin 440 related to a third modified example below can be used.

A Third Modified Example of Vertical-motion Pins

Figure 10:
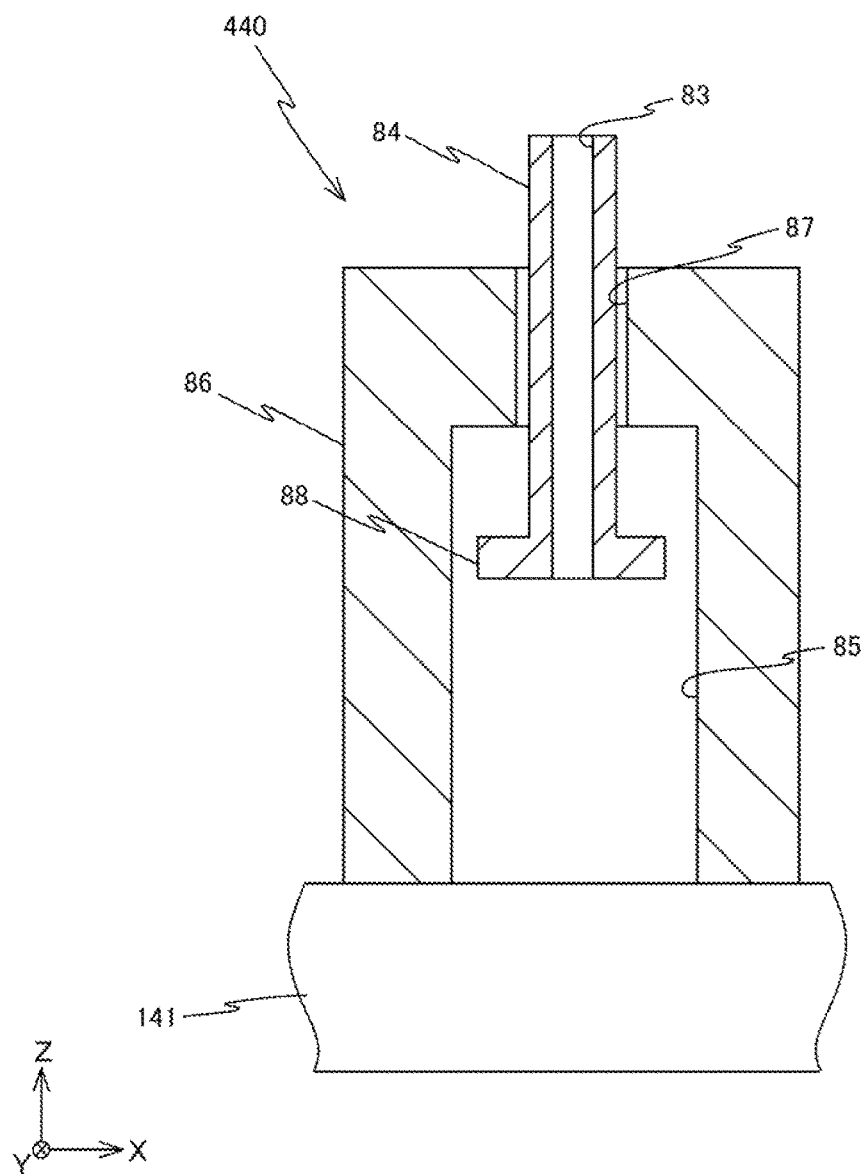
FIG. 10 is a view showing a structure of a vertical-motion pin related to a third modified example.

As is shown in FIG. 10, a vertical-motion pin 440 is equipped with a housing 86 fixed on the upper surface of platform member 141, and a shaft member 84 in which a part of the member is housed in housing 86.

Housing 86 consists of a cylindrical member with a bottom that has an opening at the lower end surface and a space 85 formed inside. Further, in the upper wall (bottom section) of housing 86, a penetrating hole 87 having a circular sectional shape whose diameter is smaller than the inner diameter of housing 86 is formed in the vertical direction. In the inner circumferential surface section of penetrating hole 87 in the upper wall of housing 86, grooves which are not shown extending in the Z-axis direction are formed at an equal spacing in the radial direction in a planar view. Hereinafter, for the sake of convenience, the grooves will be described as groove 87, using the same reference sign as penetrating hole 87.

Shaft member 84 consists of a columnar member whose diameter is slightly smaller than the diameter of penetrating hole 87 formed in the upper wall section of housing 86, and a flanged section 88 which projects outward is provided at the lower end. Flanged section 88 has an outer diameter larger than the inner diameter of penetrating hole 87. Shaft member 84 is inserted into penetrating hole 87 of housing 86 from below, and is allowed to move only in the Z-axis direction with respect to housing 86 within a predetermined stroke range. Shaft member 84 has a flanged section, a nut or the like which is not shown provided (or joined) at the outer circumference of the upper end so as to prevent the shaft member from dropping inside housing 86. Incidentally, instead of the flanged section, a nut or the like which is not shown provided at the outer circumference of the upper end in shaft member 84, the length of shaft member 84 in the long axis (Z-axis) direction can be increased with respect to housing 86, so that the upper surface of shaft member 84 is positioned above the upper surface of housing 86 when the shaft member 84 is positioned at the lowermost end of the strokes.

Further, in shaft member 84, a penetrating hole 83 is formed in the center section extending in the Z-axis direction, for example, having a circular sectional shape. Penetrating hole 83 has one end (the −Z end) connected to a vacuum pump which is not shown, via a piping which is not shown.

In the exposure apparatus that is equipped with wafer stage WST having a wafer support section in which three vertical-motion pins 440 of the structure described above are provided on the upper surface of platform member 141, loading of wafer W onto wafer table WTB is performed in a procedure similar to the embodiment described above.

On this operation, in a state immediately after supporting wafer W suctioned in a non-contact manner by chuck unit 153 (chuck member 124) corresponding to FIGS. 5C and 5D with the three vertical-motion pins 440 from below, shaft member 84 of vertical-motion pin 440 is at the lowest end position within the stroke range (or at a position in which the bottom surface is in contact with the upper surface of platform member 141).

Next, wafer W is driven downward with chuck unit 153 and vertical-motion pins 440, while a predetermined gap is maintained with respect to chuck unit 153 (chuck member 124). On this operation, driving of vertical-motion pins 440 downward may start earlier than chuck unit 153, due to the difference of driving responsiveness between chuck unit 153 and vertical-motion pins 440. In this case, immediately after the driving begins, housing 86 is driven downward within the predetermined stroke range in a state where the position of shaft member 84 is maintained. On this drive, an air flow occurs in groove 87, and in between shaft member 84 and housing 86, housing 86 is driven in a state where there is almost no friction (that is, a dynamic pressure bearing is structured in between shaft member 84 and housing 86). Then, when the upper surface of flanged section 88 hits the upper wall of housing 86, shaft member 84 will also be driven downward with housing 86 by driving device 142. Accordingly, if the downward movement of chuck unit 153 synchronous with the three vertical-motion pins 440 is started before the upper surface of flanged section 88 hits the upper wall of housing 86, generation of deformation (flexure) previously described to a downward protruded shape of the center section of wafer W caused by the driving force acting in the −Z direction by driving device 142 can be restrained.

As is described so far, in the exposure apparatus that is equipped with wafer stage WST having a wafer support section in which three vertical-motion pins 440 of the structure described above are provided on the upper surface of platform member 141, other than being able to obtain the same effect as the exposure apparatus equipped with the three vertical-motion pins 240 described above, because the structure of vertical-motion pin 440 is simplified, the weight of the entire device can be reduced. Further, because the gas supply device and a part of the piping member can be omitted, this makes the layout easy, and at the same time improves assembly workability.

Incidentally, in the vertical-motion pin 440 related to the third modified example, while the dynamic pressure bearing was structured by providing the plurality of grooves in the inner circumferential surface of penetrating hole 87 at the upper wall of housing 86, the embodiment is not limited to this, and for example, the dynamic pressure bearing can be structured by forming grooves on the outer circumferential surface of shaft member 84 in equal spacing in the axis direction. Further, shaft member 84 and housing 86 can be a sliding bearing, using members having a small friction coefficient.

Further, in the embodiment and each modified example described above (hereinafter referred to as the embodiments described above), while the shape of chuck unit 153 was circular in a planar view, the embodiments described above are not limited to this, and for example, can have a rectangular shape or the like, as long as wafer W can be suctioned from above in a non-contact manner.

Further, in the embodiments described above, while the three vertical-motion pins 140 (240, 340, 440) were each vertically moved integrally, the embodiments described above are not limited to this, and each pin can be vertically moved independently. For example, wafer support section 150 can be structured so that the three vertical-motion pins can vertically move independently, so as to keep the flatness degree of wafer W within a desired range by vertically moving the three vertical-motion pins individually, based on monitoring results of wafer flatness. Incidentally, the number of vertical-motion pins is not limited to three, and can be more or less than three pins.

Further, in the embodiments described above, while an example of a dry type exposure apparatus which performs exposure of wafer W without using liquid (water) was described, the embodiments described above can also be applied to an exposure apparatus in which a liquid immersion space including an optical path of an illumination light is formed between a projection optical system and a wafer and the wafer is exposed by the illumination light via the projection optical system and the liquid of the liquid immersion space, as is disclosed in, for example, PCT International Publication No. 99/49504, European Patent Application No. 1,420,298, PCT International Publication No. 2004/055803, U.S. Pat. No. 6,952,253 and the like. Further, the embodiments described above can also be applied to a liquid immersion exposure apparatus or the like disclosed in, for example, U.S. Patent Application Publication No. 2008/0088843.

Further, in the embodiments described above, while the case has been described where the exposure apparatus is a scanning type exposure apparatus of the step-and-scan method or the like, the embodiments are not limited to this, and the embodiments described above can also be applied to a stationary type exposure apparatus such as a stepper. Further, the embodiments described above can also be applied to a reduction projection exposure apparatus of the step-and-stitch method in which a shot area and a shot area are synthesized, an exposure apparatus of the proximity method, a mirror projection aligner or the like. Furthermore, the embodiments described above can also be applied to a multi-stage type exposure apparatus equipped with a plurality of wafer stages, as is disclosed in, for example, U.S. Pat. Nos. 6,590,634, 5,969,441, 6,208,407 or the like. Further, the embodiments described above can also be applied to an exposure apparatus equipped with a measurement stage separate from the wafer stage, including a measurement member (for example, a reference mark, and/or a sensor or the like), as is disclosed in, for example, PCT International Publication No. 2005/074014 or the like.

Further, the projection optical system in the exposure apparatus of the embodiments described above is not limited to a reduction system, and can either be an equal-magnifying or a magnifying system, and projection optical system PL is not limited to a refractive system, and can either be a reflection system or a catadioptric system, and its projection image can either be an inverted image or an erect image. Further, while the shape of the illumination area and the exposure area previously described was a rectangular shape, the embodiments are not limited to this, and for example, the shape can be an arc, a trapezoid, a parallelogram or the like.

Further, the light source of the exposure apparatus related to the embodiments described above is not limited to the ArF excimer laser, and a pulse laser light source such as a KrF excimer laser (output wavelength 248 nm), an $F_2$ laser (output wavelength 157 nm), an $Ar_2$ laser (output wavelength 126 nm), or a $Kr_2$ laser (output wavelength 146 nm), a super high pressure mercury lamp which generates a bright line such as a g-line (wavelength 436 nm), an i-line (wavelength 365 nm), or the like can also be used. Further, a harmonic wave generating device which uses a YAG laser can also be used. As other light sources, as is disclosed in, for example, U.S. Pat. No. 7,023,610, a harmonic wave can also be used as vacuum ultraviolet light, in which a single-wavelength laser beam in the infrared range or the visible range emitted by a DFB semiconductor laser or a fiber laser is amplified by a fiber amplifier doped with, for example, erbium (or both erbium and ytterbium) and wavelength conversion into ultraviolet light is performed using a non-linear optical crystal.

Further, in the embodiments described above, as illumination light IL of the exposure apparatus, the light is not limited to light having a wavelength of 100 nm or more, and as a matter of course, light having a wavelength less than 100 nm can also be used. For example, the embodiments described above can suitably be applied to an EUV exposure apparatus which uses EUV (Extreme Ultraviolet) light in the soft X-ray region (for example, a wavelength region of 5 to 15 nm). Other than this, the embodiments described above can also be applied to an exposure apparatus which uses a charged particle beam such as an electron beam or an ion beam.

Furthermore, the embodiments described above can also be applied to an exposure apparatus which synthesizes two reticle patterns on a wafer via the projection optical system and performs double exposure almost simultaneously on a shot area on the wafer by performing scanning exposure once, as is disclosed in, for example, U.S. Pat. No. 6,611,316.

Further, the object on which the pattern should be formed (the object subject to exposure on which the energy beam is irradiated) in the embodiments described above is not limited to the wafer, and may be other objects such as a glass plate, a ceramic substrate, a film member, or a mask blank.

The usage of the exposure apparatus is not limited to the exposure apparatus for manufacturing semiconductors, and the embodiments above can be widely applied, for example, to an exposure apparatus for liquid crystals that transfers a liquid crystal display devices pattern onto a square-shaped glass plate, an exposure apparatus for manufacturing an organic EL, a thin film magnetic head, an imaging element (such as a CCD), a micromachine and a DNA chip or the like. Further, the embodiments described above can also be applied to an exposure apparatus that transfers a circuit pattern onto a glass substrate or a silicon wafer for manufacturing a reticle or a mask that is used in not only microdevices such as semiconductor devices, but also used in an optical exposure apparatus, an EUV exposure apparatus, an X-ray exposure apparatus, an electron beam exposure apparatus or the like.

Electronic devices such as semiconductor devices are manufactured through the steps such as; a step for performing function/performance design of a device, a step for making a reticle based on this design step, a step for making a wafer from a silicon material, a lithography step for transferring a pattern of a mask (reticle) onto the wafer by the exposure apparatus (pattern forming apparatus) and the exposure method related to the embodiments described above, a development step for developing the wafer which has been exposed, an etching step for removing by the etching an exposed member of an area other than the area where the resist remains, a resist removing step for removing the resist that is no longer necessary since etching has been completed, a device assembly step (including a dicing process, a bonding process, and a package process), and an inspection step. In this case, in the lithography step, because the device pattern is formed on the wafer, using the exposure apparatus of the embodiments described above and performing the exposure method previously described, a highly integrated device can be manufactured with good productivity.

Incidentally, the disclosures of all publications, PCT International Publications, U.S. Patent Application Publications and U.S. Patents related to exposure apparatuses and the like that are cited in the description so far are each incorporated herein by reference.

The invention claimed is:

1. A suction device in which a suction force is made to act on a plate-like object in a non-contact manner, comprising:
a base member;
a plurality of gas flow holes provided at the base member, each of the plurality of gas flow holes making a suction force that suctions the object by blowing out gas and generating a flow of the gas in a peripheral area of the object; and
an adjustment device that has a supply device to supply the gas blown out from the plurality of gas flow holes, can adjust a state of the gas blown out from the plurality of gas flow holes via the supply device, and transforms the object by causing the suction force, made by the flow of the gas blown out from the plurality of gas flow holes, to act on the object, wherein
while the object is held by the suction force made by the flow of the gas blown out from the plurality of gas flow holes, the adjustment device adjusts a state of the gas blown out from some of the plurality of gas flow holes to be different from a state of the gas blown out from at least one of the plurality of gas flow holes other than the some of the plurality of gas flow holes, in order to adjust the suction force used to transform the object.

2. The suction device according to claim 1, wherein the adjustment device can control at least one of a flow amount, a flow velocity and a pressure of the gas blown out from the plurality of gas flow holes.

3. The suction device according to claim 1, wherein the adjustment device sets a suction force with respect to the object generated by the flow of the gas blown out from the plurality of gas holes so that the suction force becomes an optimal value corresponding to a position of each of the gas flow holes at the base member.

4. The suction device according to claim 1, wherein the plurality of gas flow holes are made into groups, and the adjustment device can control a state of the gas blown out from the gas flow holes for each group.

5. The suction device according to claim 4, wherein the plurality of gas flow holes are grouped into a first group including a plurality of gas flow holes placed at an outer circumference side of the base member and a second group including gas flow holes placed at a center side of the base member.

6. The suction device according to claim 5, wherein the adjustment device makes a suction force to the object generated by a flow of gas blown out from the gas flow holes included in the second group weaker than a suction force to the object generated by a flow of gas blown out from the gas flow holes included in the first group.

7. An exposure apparatus which forms a pattern on an object, comprising:
the suction device according to claim 1; and
a pattern generating device in which the pattern is formed by exposing the object suctioned by the suction device and carried in on a holding member with an energy beam.

8. The exposure apparatus according to claim 7, wherein the pattern generating device includes an optical system which emits the energy beam on the object, the apparatus further comprising:
a frame which holds the optical system, wherein
the suction device is vibrationally separated from the frame.

9. A device manufacturing method, including:
exposing an object using the exposure apparatus according to claim 7; and
developing the object which has been exposed.

* * * * *